United States Patent
Wang et al.

(10) Patent No.: US 9,015,550 B2
(45) Date of Patent: Apr. 21, 2015

(54) LOW DENSITY PARITY CHECK LAYER DECODER FOR CODES WITH OVERLAPPED CIRCULANTS

(71) Applicant: LSI Corporation, Milpitas, CA (US)

(72) Inventors: Chung-Li Wang, San Jose, CA (US); Dan Liu, Shanghai (CN); Qi Zuo, Shanghai (CN); Zongwang Li, San Jose, CA (US); Shaohua Yang, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 144 days.

(21) Appl. No.: 13/645,838

(22) Filed: Oct. 5, 2012

(65) Prior Publication Data

US 2014/0101510 A1    Apr. 10, 2014

(51) Int. Cl.
*H03M 13/00* (2006.01)
*H03M 13/09* (2006.01)
*H03M 13/11* (2006.01)

(52) U.S. Cl.
CPC .......... *H03M 13/09* (2013.01); *H03M 13/1117* (2013.01); *H03M 13/114* (2013.01); *H03M 13/116* (2013.01); *H03M 13/1171* (2013.01); *H03M 13/6331* (2013.01); *H03M 13/6343* (2013.01); *H03M 13/658* (2013.01)

(58) Field of Classification Search
CPC .................... H03M 13/1111; H03M 13/1137; H03M 13/114; H03M 13/116; H03M 13/118
USPC .......... 714/758, 752, E11.032, 755, 786, 800, 714/801; 375/316
See application file for complete search history.

(56) References Cited

U.S. PATENT DOCUMENTS

| | | |
|---|---|---|
| 5,701,314 A | 12/1997 | Armstrong |
| 5,712,861 A | 1/1998 | Inoue |
| 6,438,717 B1 | 8/2002 | Butler |
| 6,657,803 B1 | 12/2003 | Ling |
| 7,136,244 B1 | 11/2006 | Rothberg |
| 7,702,989 B2 | 4/2010 | Graef |
| 7,730,384 B2 | 6/2010 | Graef |
| 7,738,201 B2 | 6/2010 | Jin |
| 7,971,125 B2 | 6/2011 | Graef |
| 7,990,642 B2 | 8/2011 | Lee |
| 8,176,404 B2 | 5/2012 | Yang |
| 2003/0093741 A1* | 5/2003 | Argon et al. .................. 714/755 |
| 2006/0123318 A1* | 6/2006 | Kim et al. ..................... 714/758 |
| 2007/0067694 A1* | 3/2007 | Spencer ........................ 714/752 |
| 2009/0304111 A1* | 12/2009 | Shinya et al. ................. 375/316 |
| 2011/0080211 A1 | 4/2011 | Yang |
| 2011/0161633 A1 | 6/2011 | Xu |
| 2011/0179333 A1* | 7/2011 | Wesel et al. .................. 714/752 |
| 2012/0200954 A1 | 8/2012 | Jin |
| 2012/0236429 A1 | 9/2012 | Yang |

OTHER PUBLICATIONS

U.S. Appl. No. 13/644,542, filed Oct. 4, 2012, Shaohua Yang, Unpublished.
U.S. Appl. No. 13/483,982, filed May 30, 2012, Yang Han, Unpublished.

(Continued)

*Primary Examiner* — Guy Lamarre
(74) *Attorney, Agent, or Firm* — Hamilton DeSanctis & Cha

(57) ABSTRACT

The present inventions are related to systems and methods for decoding data in an LDPC layer decoder for LDPC codes with overlapped circulants.

20 Claims, 5 Drawing Sheets

(56) References Cited

OTHER PUBLICATIONS

U.S. Appl. No. 13/445,858, filed Apr. 12, 2012, Johnson Yen, Unpublished.
U.S. Appl. No. 13/490,849, filed Jun. 7, 2012, Johnson Yen, Unpublished.
U.S. Appl. No. 13/560,737, filed Jul. 27, 2012, Weijun Tan, Unpublished.
U.S. Appl. No. 13/602,440, filed Sep. 4, 2012, Fan Zhang, Unpublished.
U.S. Appl. No. 13/465,214, filed May 7, 2012, Chung-Li Wang, Unpublished.
U.S. Appl. No. 13/326,363, filed Dec. 15, 2011, Fan Zhang, Unpublished.
U.S. Appl. No. 13/372,600, filed Feb. 14, 2012, Shaohua Yang, Unpublished.
U.S. Appl. No. 13/644,589, filed Oct. 4, 2012, Shaohua Yang, Unpublished.
U.S. Appl. No. 13/474,672, filed May 17, 2012, Fan Zhang, Unpublished.
U.S. Appl. No. 13/459,282, filed Apr. 30, 2012, Fan Zhang, Unpublished.
U.S. Appl. No. 13/412,492, filed Mar. 5, 2012, Shaohua Yang, Unpublished.
U.S. Appl. No. 13/326,367, filed Dec. 15, 2011, Shaohua Yang, Unpublished.
U.S. Appl. No. 13/624,927, filed Sep. 22, 2012, Shaohua Yang, Unpublished.
Olmos et al., "Tree-Structure Expectation Propagation for LDPC Decoding in Erasure Channels", Cornell University Library arXiv:1009.4287 (Sep. 22, 2010).

* cited by examiner

LOW DENSITY PARITY CHECK LAYER DECODER FOR CODES WITH OVERLAPPED CIRCULANTS

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, in perhaps the simplest system, a parity bit can be added to a group of data bits, ensuring that the group of data bits (including the parity bit) has either an even or odd number of ones. When using odd parity, as the data is prepared for storage or transmission, the number of data bits in the group that are set to one are counted, and if there is an even number of ones in the group, the parity bit is set to one to ensure that the group has an odd number of ones. If there is an odd number of ones in the group, the parity bit is set to zero to ensure that the group has an odd number of ones. After the data is retrieved from storage or received from transmission, the parity can again be checked, and if the group has an even parity, at least one error has been introduced in the data. At this simplistic level, some errors can be detected but not corrected.

The parity bit may also be used in error correction systems, including in Low Density Parity Check (LDPC) decoders. An LDPC code is a parity-based code that can be visually represented in a Tanner graph 100 as illustrated in FIG. 1. In an LDPC decoder, multiple parity checks are performed in a number of check nodes 102, 104, 106 and 108 for a group of variable nodes 110, 112, 114, 116, 118, 120, 122, and 124. The connections (or edges) between variable nodes 110-124 and check nodes 102-108 are selected as the LDPC code is designed, balancing the strength of the code against the complexity of the decoder required to execute the LDPC code as data is obtained. The number and placement of parity bits in the group are selected as the LDPC code is designed. Messages are passed between connected variable nodes 110-124 and check nodes 102-108 in an iterative process, passing beliefs about the values that should appear in variable nodes 110-124 to connected check nodes 102-108. Parity checks are performed in the check nodes 102-108 based on the messages and the results are returned to connected variable nodes 110-124 to update the beliefs if necessary. LDPC decoders may be implemented in binary or non-binary fashion. In a binary LDPC decoder, variable nodes 110-124 contain scalar values based on a group of data and parity bits that are retrieved from a storage device, received by a transmission system or obtained in some other way. Messages in the binary LDPC decoders are scalar values transmitted as plain-likelihood probability values or log-likelihood-ratio (LLR) values representing the probability that the sending variable node contains a particular value. In a non-binary LDPC decoder, variable nodes 110-124 contain symbols from a Galois Field, a finite field $GF(p^k)$ that contains a finite number of elements, characterized by size $p^k$ where p is a prime number and k is a positive integer. Messages in the non-binary LDPC decoders are multi-dimensional vectors, generally either plain-likelihood probability vectors or LLR vectors.

The connections between variable nodes 110-124 and check nodes 102-108 may be presented in matrix form as follows, where columns represent variable nodes, rows represent check nodes, and a random non-zero element a(i,j) from the Galois Field at the intersection of a variable node column and a check node row indicates a connection between that variable node and check node and provides a permutation for messages between that variable node and check node:

$$H = \begin{bmatrix} a(1,1) & 0 & 0 & a(1,4) & 0 & a(1,6) & a(1,7) & 0 \\ 0 & a(2,2) & a(2,3) & 0 & a(2,5) & 0 & 0 & a(2,8) \\ a(3,1) & 0 & a(3,3) & 0 & a(3,5) & a(3,6) & 0 & 0 \\ 0 & a(4,2) & 0 & a(4,4) & 0 & 0 & a(4,7) & a(4,8) \end{bmatrix}$$

By providing multiple check nodes 102-108 for the group of variable nodes 110-124, redundancy in error checking is provided, enabling errors to be corrected as well as detected. Each check node 102-108 performs a parity check on bits or symbols passed as messages from its neighboring (or connected) variable nodes. In the example LDPC code corresponding to the Tanner graph 100 of FIG. 1, check node 102 checks the parity of variable nodes 110, 116, 120 and 122. Values are passed back and forth between connected variable nodes 110-124 and check nodes 102-108 in an iterative process until the LDPC code converges on a value for the group of data and parity bits in the variable nodes 110-124. For example, variable node 110 passes messages to check nodes 102 and 106. Check node 102 passes messages back to variable nodes 110, 116, 120 and 122. The messages between variable nodes 110-124 and check nodes 102-108 are probabilities or beliefs, thus the LDPC decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As local decoding iterations are performed in the system, messages pass back and forth between variable nodes 110-124 and check nodes 102-108, with the values in the nodes 102-124 being adjusted based on the messages that are passed, until the values converge and stop changing or until processing is halted.

In an LDPC layer decoder, the H matrix is decoded layer by layer, with multiple circulants being processed either fully or partially in parallel. However, where the processing of a circulant is dependent on the processing results for another circulant that has not been completed, a delay is introduced while waiting for the first circulant to be completed.

BRIEF SUMMARY

Embodiments of the present inventions are related to systems and methods for decoding data in an LDPC layer decoder for LDPC codes with overlapped circulants. In some embodiments, the LDPC layer decoder is pipelined with the processing of multiple layers overlapped in time. To avoid delays due to the dependencies between circulants in neighboring layers, the LDPC layer decoder uses data calculated in an earlier decoding iteration for overlapped circulants. Decoding may thus continue without waiting for the most recent results for a circulant. In some cases, memory is increased in the LDPC layer decoder to temporarily store the data calculated in an earlier decoding iteration. In some embodiments, the LDPC layer decoder is provided with an indication of which circulants are overlapped to control when data calculated in an earlier decoding iteration should be used in place of the most recent data. In some embodiments, the indication is a read only memory (ROM) with flags identifying overlapped circulants.

In some embodiments, out-of-order circulant processing is performed in the LDPC layer decoder to rotate the effects of using earlier data for overlapped circulants. In these embodiments, the circulant processing may be different for each layer in a decoding iteration. In some instances, the circulant processing order in each layer of a decoding iteration is also different from other decoding iterations.

This summary provides only a general outline of some embodiments according to the present invention. Many other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
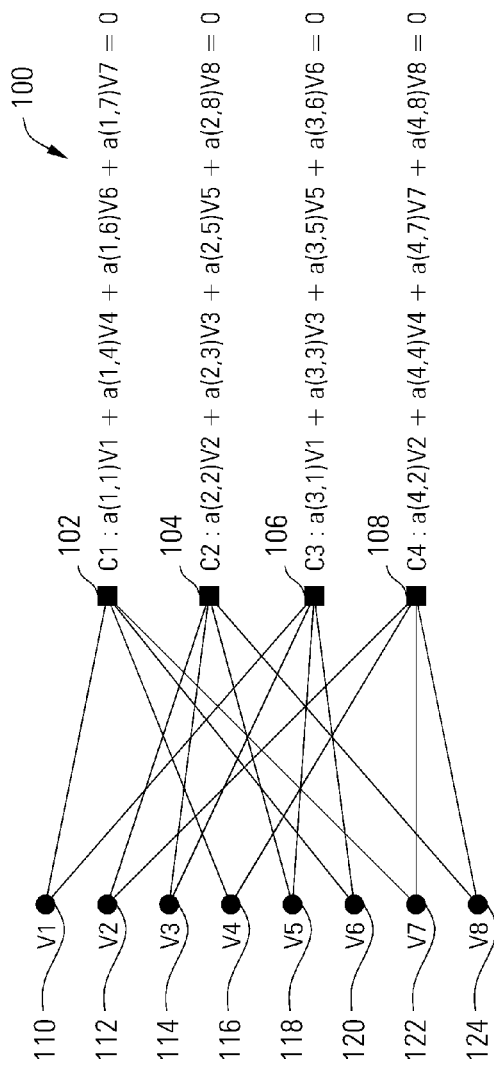
FIG. 1 depicts a Tanner graph of an example prior art LDPC code.

Embodiments of the present inventions are related to systems and methods for decoding data in an LDPC layer decoder for LDPC codes with overlapped circulants. The term "overlapped circulant" refers herein to circulants in a same H-matrix column that are processed at least partly in parallel in LDPC layer decoder. LDPC technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In some embodiments, the LDPC layer decoder is pipelined with the processing of multiple layers overlapped in time. To avoid delays due to the dependencies between circulants in neighboring layers, the LDPC layer decoder uses data calculated in an earlier decoding iteration for overlapped circulants. Decoding may thus continue without waiting for the most recent results for a circulant. In some cases, memory is increased in the LDPC layer decoder to temporarily store the data calculated in an earlier decoding iteration. In some embodiments, the LDPC layer decoder is provided with an indication of which circulants are overlapped to control when data calculated in an earlier decoding iteration should be used in place of the most recent data. In some of these embodiments, the indication is a read only memory (ROM) with flags identifying overlapped circulants.

In some embodiments, out-of-order circulant processing is performed in the LDPC layer decoder to rotate the effects of using earlier data for overlapped circulants. In these embodiments, the circulant processing may be different for each layer in a decoding iteration. In some instances, the circulant processing order in each layer of a decoding iteration is also different from other decoding iterations.

The LDPC layer decoder used in various embodiments may be any type of LDPC decoder, including binary and non-binary, and using any suitable decoding algorithm. For example, in some embodiments, the LDPC layer decoder performs min-sum based layered decoding of multi-level (or non-binary) LDPC codes. In the min-sum based decoding, also referred to as simplified min-sum decoding, the check nodes calculate the minimum sub-message $min_1(d)$, the index $idx(d)$ of $min_1$), and the sub-minimum or next minimum sub-message $min_2(d)$, or minimum of all sub-messages excluding $min_1(d)$, for each nonzero symbol d in the Galois Field based on all extrinsic V2C messages from neighboring variable nodes. In other words, the sub-messages for a particular symbol d are gathered from messages from all extrinsic inputs, and the $min_1(d)$, $idx(d)$ and $min_2(d)$ is calculated based on the gathered sub-messages for that symbol d. For a Galois Field with q symbols, the check node will calculate the $min_1(d)$, $idx(d)$ and $min_2(d)$ sub-message for each of the q−1 non-zero symbols in the field except the most likely symbol. The $min_1(d)$, $idx(d)$ and $min_2(d)$ values are stored in a memory for use in calculating the C2V message, requiring much less memory than the traditional non-binary LDPC check node processor that stores each intermediate forward and backward message. An example of the simplified min-sum decoding is provided for a multi-level non-layer LDPC decoder in U.S. patent application Ser. No. 13/180,495 filed on Jul. 11, 2011 for a "Min-Sum Based Non-Binary LDPC Decoder", which is incorporated by reference herein for all purposes.

The multi-level LDPC layer decoder uses quasi-cyclic LDPC codes in which the parity check H matrix is an array of circulant sub-matrices, cyclically shifted versions of identity matrices and null matrices with different cyclical shifts. In some embodiments, the H matrix is constructed based on the finite field GF(4), although other field sizes may be used, with M circulant rows and N circulant columns, and with each circulant being a b×b sub-matrix with the form:

$$B_{i,j} = \begin{bmatrix} 0 & \alpha^{p_{i,j}} & 0 & \ldots & 0 \\ 0 & 0 & \alpha^{p_{i,j}} & \ldots & 0 \\ \vdots & \vdots & \vdots & \ddots & \vdots \\ 0 & 0 & 0 & \ldots & \alpha^{p_{i,j}} \\ \alpha^{p_{i,j}} & 0 & 0 & \ldots & 0 \end{bmatrix}$$

In the multi-level LDPC layer decoder, the parity check H matrix of the LDPC code is partitioned into L layers, with the H matrix being processed row by row and the circulants being processed layer by layer. As the rows are processed, the column results are updated based on each row result. Layered decoding can reduce the time to converge on a result in the decoder in some cases.

Each layer is processed column by column, processing non-zero entries (or circulants) in H-matrix columns. Because the decoder may begin processing one layer before completing processing the previous layer, data dependencies between layers may introduce delays in processing. To avoid these delays, when a circulant being processed is dependent or overlapped with a circulant in the previous layer, the data for the circulant in the previous layer is retrieved from a previous decoding iteration rather than waiting for the processing of the circulant in the previous layer to be completed in the current iteration. Overlapped processing of layers may occur not only in pipelined decoder architectures that process multiple layers in parallel, but also in decoder architectures that process single layers at a time, but which may perform variable node and check node processing either partially or entirely in parallel.

Figure 2:
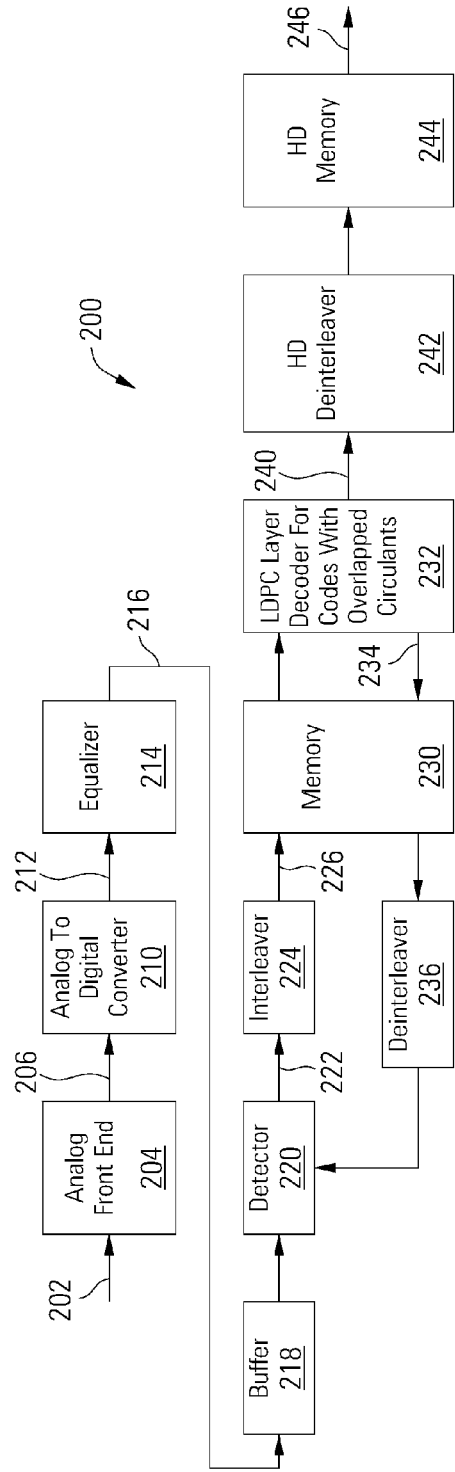
FIG. 2 depicts a block diagram of a read channel with an LDPC layer decoder for codes with overlapped circulants which may be used to retrieve or receive stored or transmitted data in accordance with some embodiments of the present inventions.

Although the LDPC layer decoder for LDPC codes with overlapped circulants disclosed herein is not limited to any particular application, several examples of applications are presented herein that benefit from embodiments of the present inventions. Turning to FIG. 2, a read channel 200 is used to process an analog signal 202 and to retrieve user data bits from the analog signal 202 without errors. In some cases, analog signal 202 is derived from a read/write head assembly in a magnetic storage medium. In other cases, analog signal 202 is derived from a receiver circuit that is operable to receive a signal from a transmission medium. The transmission medium may be wireless or wired such as, but not limited to, cable or optical connectivity. Based upon the disclosure provided herein, one of ordinary skill in the art will recognize a variety of sources from which analog signal 202 may be derived.

The read channel 200 includes an analog front end 204 that receives and processes the analog signal 202. Analog front end 204 may include, but is not limited to, an analog filter and an amplifier circuit as are known in the art. Based upon the disclosure provided herein, one of ordinary skill in the art will recognize a variety of circuitry that may be included as part of analog front end 204. In some cases, the gain of a variable gain amplifier included as part of analog front end 204 may be modifiable, and the cutoff frequency and boost of an analog filter included in analog front end 204 may be modifiable. Analog front end 204 receives and processes the analog signal 202, and provides a processed analog signal 206 to an analog to digital converter 210.

Analog to digital converter 210 converts processed analog signal 206 into a corresponding series of digital samples 212. Analog to digital converter 210 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 212 are provided to an equalizer 214. Equalizer 214 applies an equalization algorithm to digital samples 212 to yield an equalized output 216. In some embodiments of the present invention, equalizer 214 is a digital finite impulse response filter circuit as is known in the art. Data or codewords contained in equalized output 216 may be stored in a buffer 218 until a data detector 220 is available for processing.

The data detector 220 performs a data detection process on the received input, resulting in a detected output 222. In some embodiments of the present invention, data detector 220 is a Viterbi algorithm data detector circuit, or more particularly in some cases, a maximum a posteriori (MAP) data detector circuit as is known in the art. In these embodiments, the detected output 222 contains log-likelihood-ratio (LLR) information about the likelihood that each bit or symbol has a particular value. Based upon the disclosure provided herein, one of ordinary skill in the art will recognize a variety of data detectors that may be used in relation to different embodiments of the present invention. Data detector 220 is started based upon availability of a data set in buffer 218 from equalizer 214 or another source.

The detected output 222 from data detector 220 is provided to an interleaver 224 that protects data against burst errors. Burst errors overwrite localized groups or bunches of bits. Because LDPC decoders are best suited to correcting errors that are more uniformly distributed, burst errors can overwhelm LDPC decoders. The interleaver 224 prevents this by interleaving or shuffling the detected output 222 from data detector 220 to yield an interleaved output 226 which is stored in a memory 230. The interleaved output 226 from the memory 230 is provided to an LDPC layer decoder for codes with overlapped circulants 232 which performs parity checks on the interleaved output 226, ensuring that parity constraints established by an LDPC encoder (not shown) before storage or transmission are satisfied in order to detect and correct any errors that may have occurred in the data during storage or transmission or during processing by other components of the read channel 200.

Multiple detection and decoding iterations may be performed in the read channel 200, referred to herein as global iterations. (In contrast, local iterations are decoding iterations performed within the LDPC decoder 232.) To perform a global iteration, LLR values 234 from the LDPC decoder 232 are stored in memory 230, deinterleaved in a deinterleaver 236 to reverse the process applied by interleaver 224, and provided again to the data detector 220 to allow the data detector 220 to repeat the data detection process, aided by the LLR values 234 from the LDPC decoder 232. In this manner, the read channel 200 can perform multiple global iterations, allowing the data detector 220 and LDPC decoder 232 to converge on the correct data values.

The LDPC decoder 232 also produces hard decisions 240 about the values of the data bits or symbols contained in the interleaved output 226 of the interleaver 224. For binary data bits, the hard decisions may be represented as 0's and 1's. In a GF(4) LDPC decoder, the hard decisions may be represented by four field elements 00, 01, 10 and 11.

The hard decisions 240 from LDPC decoder 232 are deinterleaved in a hard decision deinterleaver 242, reversing the process applied in interleaver 224, and stored in a hard decision memory 244 before being provided to a user or further processed. For example, the output 246 of the read channel 200 may be further processed to reverse formatting changes applied before storing data in a magnetic storage medium or transmitting the data across a transmission channel.

Figure 3:
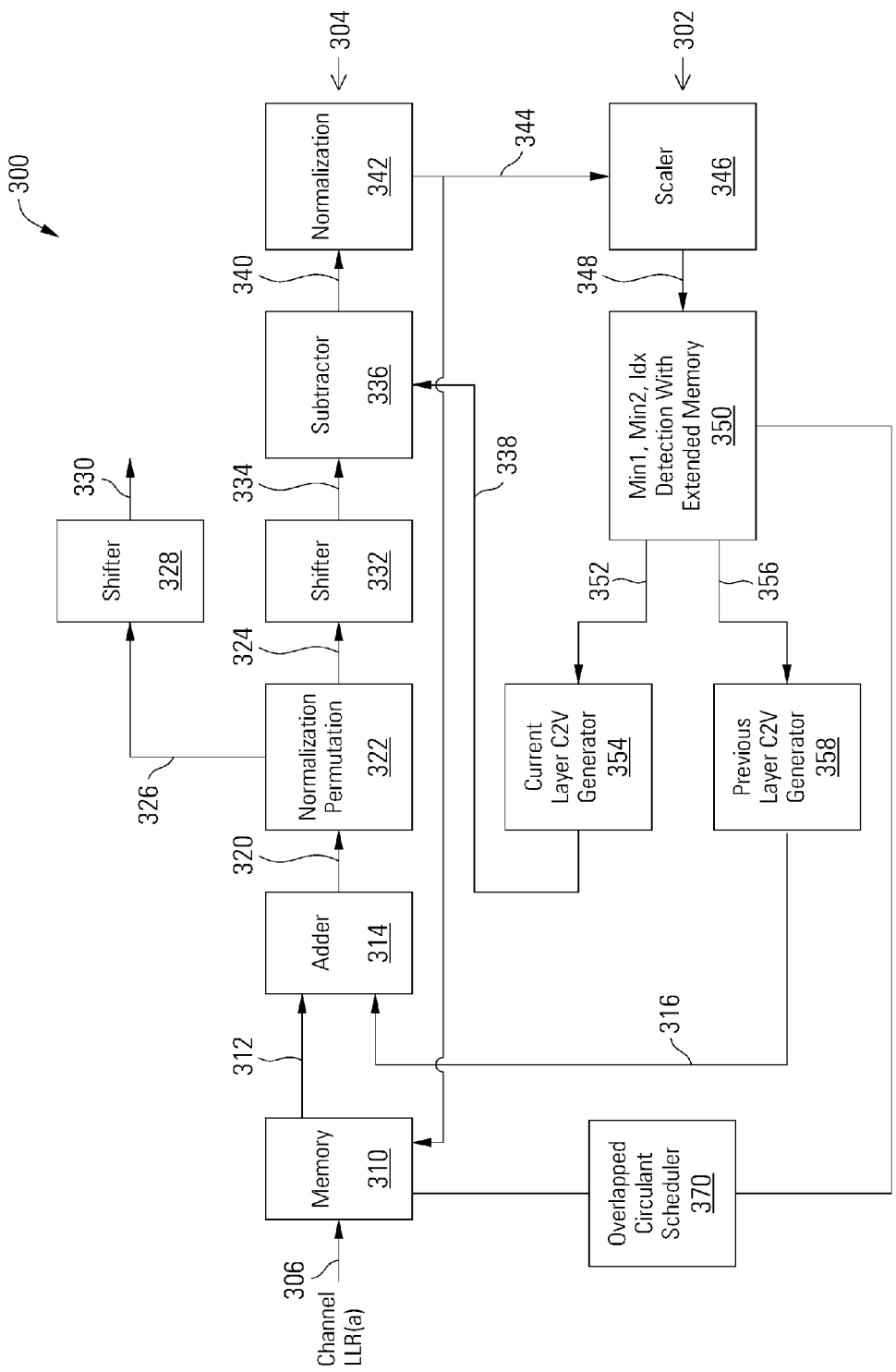
FIG. 3 depicts a block diagram of a multi-level LDPC layer decoder for codes with overlapped circulants in accordance with some embodiments of the present inventions.

Turning to FIG. 3, a multi-level LDPC layer decoder for codes with overlapped circulants 300 is illustrated in block-diagram form in accordance with some embodiments of the present inventions. The multi-level LDPC layer decoder 300 generates C2V messages from a check node processor 302 to a variable node processor 304 using min-sum based check node calculations. Incoming LLR values for data to be decoded are received on an input 306 and stored in a Q value memory 310. The memory 310 stores soft LLR input values from the input 306 and Q values of each symbol, representing the likelihood that an input symbol has the value of each element of the Galois Field. For a GF(4) LDPC decoder, the Q values consist of one hard decision and three soft LLR values, or four soft LLR values in an equivalent but alternative format.

The memory 310 yields stored Q values 312 or $Q_n(a)$ for the layer previous to the layer currently being processed, also referred to herein as the previous layer and the connected layer. An adder 314 adds the Q values 312 to previous layer C2V messages 316 or $R_{1,n}(a)$ in array fashion to produce S messages 320 or $S_n(a)$ containing total soft LLR values for the previous layer. Again, columns in the H matrix represent variable nodes, and by adding all the non-zero entries in a column, the connected variable nodes are added to yield the input to a check node.

The S messages 320 are provided to a normalization and permutation circuit 322, which converts the format of the S messages 320 from four soft LLR values to the equivalent content but different format of one hard decision and four soft LLR values (for a GF(4) embodiment), and which applies a permutation to rearrange the variable node updated values to prepare for the check node update and to apply the permutations specified by the non-zero elements of the H matrix. For example, in a GF(4) embodiment, the four elements 0-3 of the Galois Field are 0, 1, α, $α^2$. The permutation applied by normalization and permutation circuit 322 is multiplication in the Galois Field. Element 2 (α) multiplied by element 1 (1) equals α×1 or α, which is element 2. Similarly, element 2×2=α×α=$α^2$, which is element 3. Element 2×3=α×$α^2$=1, which is element 1. Thus, element 2 multiplied by 1, 2 and 3 results in elements 2, 3, and 1, which are permutations of elements 1, 2 and 3. The normalization and permutation circuit 322 yields P messages 324 or $P_n(a)$ for the previous layer. The 322 also yields soft LLR values 326 which are provided to a cyclic shifter 328. Cyclic shifter 328 rearranges the soft LLR values 326 to column order, performs a barrel shift which shifts the normalized soft LLR values 326 from the previous layer to the current layer, and which yields hard decisions 330 or $a_n^*$, calculated as $\mathrm{argmin}_a S_n(a)$.

The P messages 324 from the normalization and permutation circuit 322 are also provided to a shifter 332, a cyclic shifter or barrel shifter which shifts the symbol values in the normalized LLR P messages 324 to generate the next circulant sub-matrix, yielding current layer P messages 334 which contain the total soft LLR values of the current layer.

The current layer P messages 334 are provided to a subtractor 336 which subtracts the current layer C2V messages 338, or $R_{2,n}(a)$, from the current level P messages 334, yielding D messages 340, or $D_n(a)$. The current layer C2V messages 338 are old values for the current layer, generated during a previous decoding iteration. Generally, the C2V vector message from a check node to a variable node contains the probabilities for each symbol d in the Galois Field that the destination variable node contains that symbol d, based on the prior round V2C messages from neighboring variable nodes other than the destination variable node. The inputs from neighboring variable nodes used in a check node to generate the C2V message for a particular neighboring variable node are referred to as extrinsic inputs and include the prior round V2C messages from all neighboring variable nodes except the particular neighboring variable node for which the C2V message is being prepared, in order to avoid positive feedback. The check node prepares a different C2V message for each neighboring variable node, using the different set of extrinsic inputs for each message based on the destination variable node. Subtracting the current layer C2V messages 338 from an earlier iteration removes the intrinsic input, leaving only the extrinsic inputs to generate a C2V message for a variable node.

D messages 340 are provided to a normalization circuit 342 which converts the format of the D messages 340 from four soft LLR values to the equivalent content but different format of one hard decision and three soft LLR values, yielding new Q messages 344, or $Q_{2,n}(a)$, also referred to as V2C messages, for the current layer. The Q messages 344 are stored in memory 310, overwriting previous channel or calculated values for the current layer, and are also provided to a scaler 346 which scales the Q messages 344 to yield scaled V2C messages 348, or $T_{2,n}(a)$.

V2C messages 348 are provided to a min finder circuit 350 which calculates the minimum value $\min_1(d)$, second or next minimum value $\min_2(d)$ and the index of the minimum value idx(d). The min finder circuit 350 also calculates the signs of the V2C messages 348 and tracks the sign value of each non-zero element of the H matrix and the cumulative sign for the current layer. The min finder circuit 350 yields the current layer minimum, next minimum and index values with the sign values 352 to a current layer C2V generator 354, which calculates the current layer C2V messages 338, or $R_{2,n}(a)$. The min finder circuit 350 also yields the previous layer minimum, next minimum and index values with the sign values 356 to a previous layer C2V generator 358, which calculates the previous layer C2V messages 316, or $R_{1,n}(a)$. The current layer C2V generator 354 and previous layer C2V generator 358 generate the C2V or R messages 338 and 316 based on the final state and current column index of the symbol. If the current column index is equal to the index of the minimum value, then the value of R is the second minimum value. Otherwise, the value of R is the minimum value of that layer. The sign of R is the XOR of the cumulative sign and the current sign of the symbol.

The variable node processor 304 and the check node processor 302 thus operate together to perform layered decoding of non-binary or multi-level data. The variable node processor 304 generates variable node to check node messages (V2C messages) and calculates perceived values based on check node to variable node messages (C2V messages). The check node processor 302 generates C2V messages and calculates checksums based on V2C messages, using a min finder circuit operable to identify a minimum, a next minimum and an index of minimum value in the V2C messages.

As disclosed above, during normal operation the LDPC layer decoder for codes with overlapped circulants 300 generates C2V messages for a previous layer (e.g., 316) and for a current layer (e.g., 338), using data from the current iteration for the previous layer C2V messages 316 and from a preceding iteration for the current layer C2V messages 338. In this embodiment, the min finder circuit 350 is thus provided with memory to store data for two layers in two iterations. To enable layered decoding of codes with overlapped circulants, the memory is increased or extended so that data from an earlier iteration is available if processing of the overlapped circulants is not complete.

An overlapped circulant scheduler 370 controls the decoding process in the LDPC layer decoder for codes with overlapped circulants 300, including the scheduling of each layer, the circulant processing order within each layer, and determining when a circulant is overlapped with a circulant in a previous layer. When a circulant is overlapped with a circulant in a previous layer, the overlapped circulant scheduler 370 causes the LDPC layer decoder for codes with overlapped circulants 300 to use data from a preceding iteration for the previous layer C2V messages 316 in adder 314, rather than waiting for processing to be complete on the circulant in the previous layer. The overlapped circulant scheduler 370 also causes the LDPC layer decoder for codes with overlapped circulants 300 to use data from a twice-preceding iteration for the current layer C2V messages 338, so that the data subtracted in the subtractor 336 corresponds correctly with the data added in the adder 314. Thus, when excluding the intrinsic inputs in subtractor 336, the subtracted data are taken from the same iteration as the data for the intrinsic inputs that were originally added in the adder 314.

Figure 4:
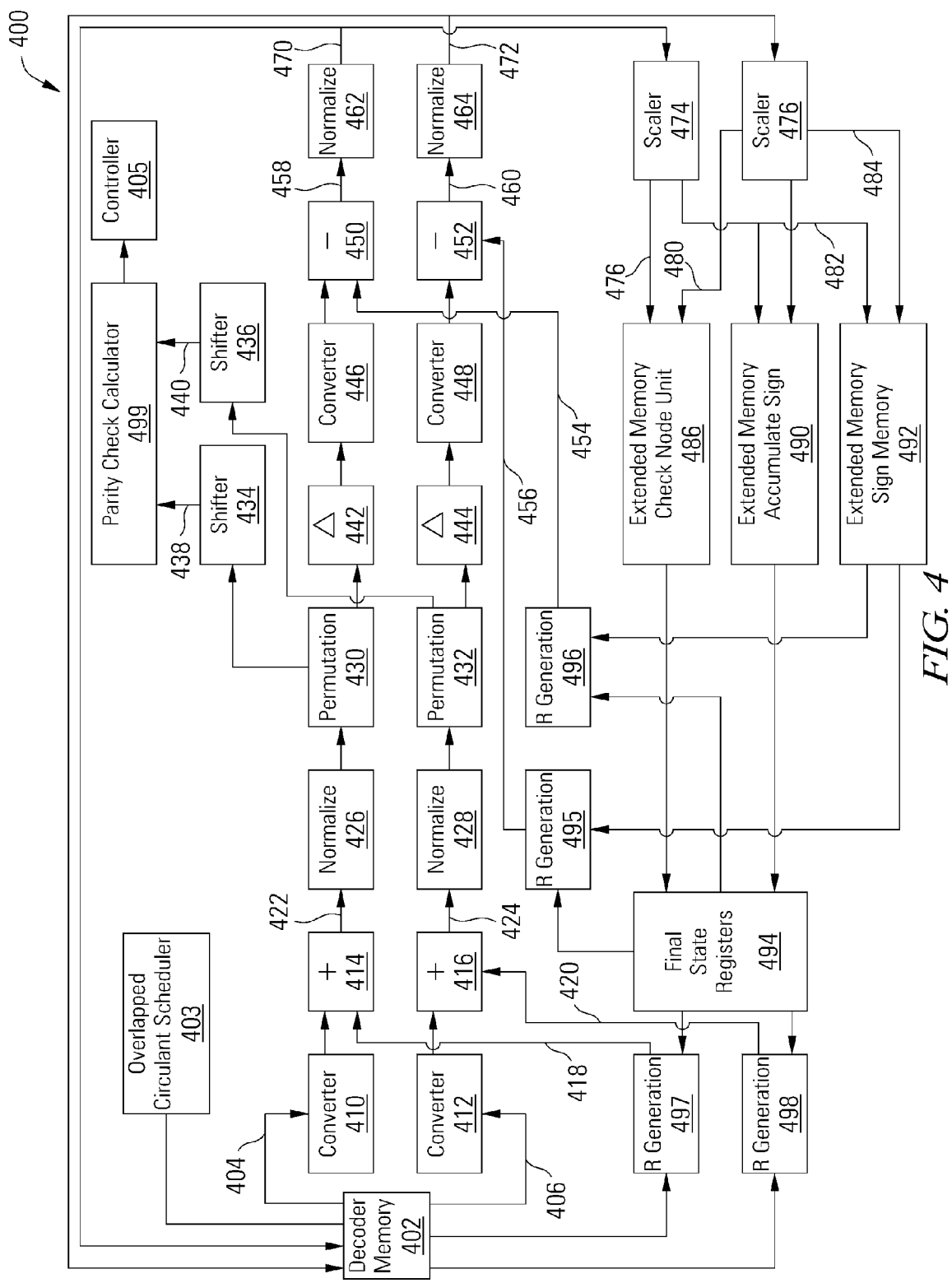
FIG. 4 depicts a block diagram of a multi-level LDPC layer decoder with parallel circulant processing for codes with overlapped circulants in accordance with some embodiments of the present inventions.

The LDPC layer decoder for codes with overlapped circulants may also be a pipelined decoder adapted to process multiple circulants at a time. An embodiment is disclosed in FIG. 4, in which an LDPC layer decoder for codes with overlapped circulants 400 is operable to process two circulants in parallel using a simplified min-sum based decoding algorithm. Again, it is important to note that the LDPC layer decoder for codes with overlapped circulants 400 is not limited to use with min-sum based decoding or to any particular LDPC decoding algorithm.

A decoder memory 402 in the LDPC layer decoder for codes with overlapped circulants 400 stores soft LLR input values, Q values, and soft LLR output P values. The decoder memory 402 is a ping pong memory. The decoder memory 402 provides Q values 404 and 406 of the connected (or previous) layer to converters 410 and 412, respectively, each based on a different circulant being processed. In a GF(4) embodiment, the Q values 404 and 406 each consist of one hard decision and three soft LLR values.

The converters 410 and 412 convert the Q values from a format containing a hard decision and three soft LLR values to a format containing four soft LLR values, with the information being equivalent in the two formats. Adders 414 and 416 add the connected layer's Q value (converted by converters 410 and 412) to the connected layer's R value 418 and 420 (also referred to herein as previous layer C2V messages) of each symbol of a circulant respectively, yielding the soft LLR values 422 and 424 of each symbol. In an embodiment with GF(4), each adder 414 and 416 consists of four adders each, adapted to add the connected layer's Q value with the connected layer's R value of each symbol of a circulant respectively to obtain the soft LLR values 422 and 424 of each symbol.

The soft LLR values 422 and 424 of each symbol are provided to normalizers 426 and 428, which compare the four values in each of the soft LLR values 422 and 424 to identify the minimum of each, and which subtract that minimum from the other three soft LLR values, thereby normalizing each of the soft LLR values 422 and 424 to their respective minimum.

The normalized variable node LLR values from normalizers 426 and 428 are provided to permutation circuits 430 and 432, which rearrange the variable node updated values to prepare for the check node update and apply the permutations specified by the non-zero elements of the H matrix. In a GF(4) embodiment, the four elements 0-3 of the Galois Field are 0, 1, $\alpha$, $\alpha^2$. The permutation applied by permutation circuits 430 and 432 is multiplication in the Galois Field. Element 2 ($\alpha$) multiplied by element 1 (1) equals $\alpha \times 1$ or $\alpha$, which is element 2. Similarly, element $2 \times 2 = \alpha \times \alpha = \alpha^2$, which is element 3. Element $2 \times 3 = \alpha \times \alpha^2 = 1$, which is element 1. Thus, element 2 multiplied by 1, 2 and 3 results in elements 2, 3, and 1, which are permutations of elements 1, 2 and 3. In the parity check calculation, each hard decision value is multiplied by the non-zero elements (1, 2, or 3) of the H matrix, and the results are XORed together.

Shifters 434 and 436 process the output of permutation circuits 430 and 432 to shift the soft LLR values back to column order to yield soft LLR outputs 438 and 440 as the hard decisions used by a parity check calculator check calculator 499. Shifters 434 and 436 are used to shift from row order to column order because the LDPC layer decoder 400 processes data in row order, but the output total soft LLR is ordered by column in order to subtract the input LLR which is in column order to get the extrinsic LLR value. Delta shifters 442 and 444 also process the output of permutation circuits 430 and 432, shifting the output of the permutation circuits 430 and 432 by the difference in the circulant shift numbers of the current layer and the connected layer. In a given column there are circulants with different shift numbers, and the delta shifters 442 and 444 compensate for the different shift numbers of the current layer and the connected layer.

The output of delta shifters 442 and 444 is provided to converters 446 and 448 which convert from the format containing one hard decision and three soft LLR values back to the format containing four soft LLR values. Subtractors 450 and 452 then subtract the R values 454 and 456 of the symbols of the current layer (generated in a preceding iteration) from the soft LLR P values provided by converters 446 and 448 to obtain Q values 458 and 460 of the symbols of the current layer, in order to include only extrinsic inputs. The Q values 458 and 460 of the symbols of the current layer are then normalized in normalizers 462 and 464, which compare the four values in each of the Q values 458 and 460 to identify the minimum of each, and which subtract that minimum from the other three elements of the Q values 458 and 460, thereby normalizing each of the Q values 458 and 460 to their respective minimum. The normalized Q values 470 and 472 are provided to the decoder memory 402 to update the Q values of the current layers, and also to scalers 474 and 476 to obtain the new Q values to perform the check node to variable node update.

Scalers 474 and 476 scale the normalized Q values 470 and 472 from the normalizers 462 and 464, yielding the new Q values 478 and 480, or absolute soft values, along with the Q values signs 482 and 484. The new Q values 478 and 480 and their signs 482 and 484 are provided to the check node unit 486 which finds the minimum value, second or next minimum value and the index of the minimum value. The new Q values signs 482 and 484 are also provided to a sign accumulator 490, which calculates and stores the cumulative sign for the current layer of the Q values 478 and 480, and to a sign memory 492 which stores the sign value of each non-zero element of the H matrix.

Final state registers 494 store the final state consisting of the minimum value, the second minimum value, the index of the minimum value, and cumulative sign of the current layer. These final state values are provided to two sets of R generators 495, 496, 497 and 498, which generate the R value for the connected layer or current layer based on the final state and current column index of the symbol. R generators 495 and 496 generate the R values for the current layer of the two circulants being processed, and R generators 497 and 498 generate the R values for the connected layer of the two circulants being processed. If the current column index is equal to the index of the minimum value, then the value of R is the second minimum value. Otherwise, the value of R is the minimum value of that layer. The sign of R is the XOR of the cumulative sign and the current sign of the symbol.

During operation of the LDPC layer decoder 400, as Q values and R values are iteratively circulated through the decoder 400, a parity check calculator 499 calculates parity checks based on soft LLR outputs 438 and 440. If the unsatisfied check number calculated by the parity check calculator 499 is equal to zero after all layers have been processed, the LDPC layer decoder 400 has converged and processing can be halted and the decoded data provided to a controller 405.

A fractional iteration scheduler 403 determines the number of full and fractional local decoding iterations to perform in the LDPC layer decoder 400 during a global iteration, based on the processing time in an external detector (e.g., channel detector 204 or 210). In some embodiments, the fractional iteration scheduler 403 assigns the number of full and fractional local decoding iterations that will come close to the detector processing time without exceeding it. In some other embodiments, the fractional iteration scheduler 403 may allow the decoder processing time to slightly exceed the detector processing time. The fractional iteration scheduler 403 may cause fractional local decoding iterations to be performed at the beginning, middle or end of a global local decoding iteration. The fractional iteration scheduler 403 may determine in advance or at the beginning of a global decoding iteration the number of full and fractional local decoding iterations to perform in the LDPC layer decoder 400, or may determine at the beginning of each local decoding iteration whether enough decoder processing time remains for a full or a fractional local decoding iteration without exceeding the detector processing time.

An overlapped circulant scheduler 403 controls the decoding process in the LDPC layer decoder for codes with overlapped circulants 400, including scheduling decoding of layers, the processing order of circulants, and the determination of whether a connected circulant in a connected layer is overlapped. This determination may be made, for example, using flags stored in a ROM identifying overlapped circulants in each stage of the decoding process.

The check node unit 486, sign accumulator 490, sign memory 492 and final state registers 494 are provided with sufficient memory to store data for the current layer and the connected or previous layer in at least two iterations, the preceding iteration, and the twice-preceding iteration (or the iteration before the preceding iteration). As current iteration data is generated, it may overwrite the twice-preceding iteration data. When processing a non-overlapped circulant, the adders 414, 416 add previous layer data from the current iteration, and the subtractors 450, 452 subtract current layer data from the preceding iteration. When processing an overlapped circulant, the adders 414, 416 add previous layer data from the preceding iteration, and the subtractors 450, 452 subtract current layer data from the twice-preceding iteration.

Consider, for example, a numerical embodiment in which two layers, layer 0 and layer 1, are processed. For a non-overlapped circulant, when performing decoding iteration 4 and processing layer 1, the C2V messages of layer 0 (the previous layer) from iteration 4 will be added in adders 414, 416 when processing the columns that have non-zero circulants in layer 0. Then, when processing layer 0 in iteration 5, the C2V messages of layer 0 from iteration 4 will be subtracted in subtractors 450, 452. When processing an overlapped circulant, when performing decoding layer 1 in iteration 4, the C2V messages for the overlapped circulant in layer 0 (the previous layer) may not be available for iteration 4 because of the overlapping. Therefore, to avoid a delay, the C2V of layer 0 (the previous layer) from iteration 3 (the preceding iteration) will be added in adders 414, 416 when processing the columns that have overlapped non-zero circulants in layer 0. Then when processing layer 0 in iteration 5, the C2V message for layer 0 from iteration 3 (the twice-preceding iteration) will be subtracted in subtractors 450, 452, so that the subtrahends correspond to the addends or are taken from the same iteration. The check node unit 486, sign accumulator 490, sign memory 492 and final state registers 494 is thus increased so that twice-preceding iteration min1/min2/idx data is available. At iteration 5, layer 0, one memory block contains iteration 4 data, and another memory block contains iteration 3 data. Once processing of layer 0 is complete in this example, the min1/min2/idx data for iteration 5 will overwrite the data for iteration 3, which is no longer needed.

In summary, circulants may be overlapped in a layer decoder both in pipelined and non-pipelined architectures. In a pipelined architecture such as that in FIG. 4, the decoder processes two circulants at a time, so processing of the current layer begins before the processing of the previous layer is complete. The VNU needs the C2V message for the layer having the previously processed circulant in the same column. If the previously processed circulant is in the previous layer, the required data from the previously processed circulant may not yet be ready in the register. Rather than wait until the previously processed circulant is complete, the LDPC layer decoder for codes with overlapped circulants uses the data for the same layer but from the last iteration. The LDPC layer decoder for codes with overlapped circulants includes enough memory to store the new and old versions of the data, as well as an identification of the overlapped circulants, enabling the scheduler to select either the new or old versions of data.

In one embodiment, three blocks of memory space are used to store the min1/min2/idx values. With overlapped columns, six total blocks of memory space are provided for two iterations of min1/min2/idx values, such that in each iteration i+1, the data from iterations i and i−1 are still available until the data from iter i+1 is ready. In some cases, two banks 0 and 1 are used. For the i-th iteration, if i%2=0 (in other words, if i modulo 2 is 0, or if i is even), data is stored in bank0, otherwise in bank1. Additional memory may also be provided to store two versions of the syndromes and hard decisions for each row.

By avoiding delays while waiting for overlapped circulants, more decoding iterations may be performed in the same amount of time. However, the overlapped circulants may converge one iteration slower than non-overlapped circulants, because they use data that is one iteration older. Error-correction capability may thus be impacted in columns with overlapped circulants. To more evenly distribute the impact of using older data, out-of-order circulant processing may be applied within each layer. An example circulant processing order for each layer in each of four decoding iterations is disclosed below, with bolded circulant numbers representing overlapped circulants for which out of date (preceding iteration) previous layer C2V messages are added, and with italicized circulant numbers representing circulants for which out of date (twice-preceding iteration) current layer C2V messages are subtracted.

---

Iteration 0
1 2 3 4 5 6 7 8 9 10 *11 12 13 14 15 16 17 18* 19 20 21 22 23 24 25 26 27 28
11 12 13 14 15 16 17 18 19 *20 21 22 23 24 25 26 27 28* 1 2 3 4 5 6 7 8 9 10
21 22 23 24 25 26 27 28 *1 2 3 4 5 6 7 8 9* 10 11 12 13 14 15 16 17 18 19 20
Iteration 1
11 12 13 14 15 16 17 18 19 20 *21 22 23 24 25 26 27 28* 1 2 3 4 5 6 7 8 9 10
21 22 23 24 25 26 27 28 *1 2 3 4 5 6 7 8 9* 10 11 12 13 14 15 16 17 18 19 20
1 2 3 4 5 6 7 8 9 10 *11 12 13 14 15 16 17 18* 19 20 21 22 23 24 25 26 27 28
Iteration 2
21 22 23 24 25 26 27 28 *1 2 3 4 5 6 7 8 9* 10 11 12 13 14 15 16 17 18 19 20
1 2 3 4 5 6 7 8 9 10 *11 12 13 14 15 16 17 18* 19 20 21 22 23 24 25 26 27 28
11 12 13 14 15 16 17 18 19 20 *21 22 23 24 25 26 27 28* 1 2 3 4 5 6 7 8 9 10
Iteration 3
1 2 3 4 5 6 7 8 9 10 *11 12 13 14 15 16 17 18* 19 20 21 22 23 24 25 26 27 28
11 12 13 14 15 16 17 18 19 20 *21 22 23 24 25 26 27 28* 1 2 3 4 5 6 7 8 9 10
21 22 23 24 25 26 27 28 *1 2 3 4 5 6 7 8 9* 10 11 12 13 14 15 16 17 18 19 20

---

Again, the subtracting of C2V messages for a particular layer is performed one iteration later than the adding of the C2V messages for the layer. The C2V messages for a layer that are added and subtracted are taken from the same decoding iteration.

Notably, in this example, the circulant processing order differs from layer to layer within a decoding iteration, and the circulant processing order across layers differs from iteration to iteration.

Figure 5:
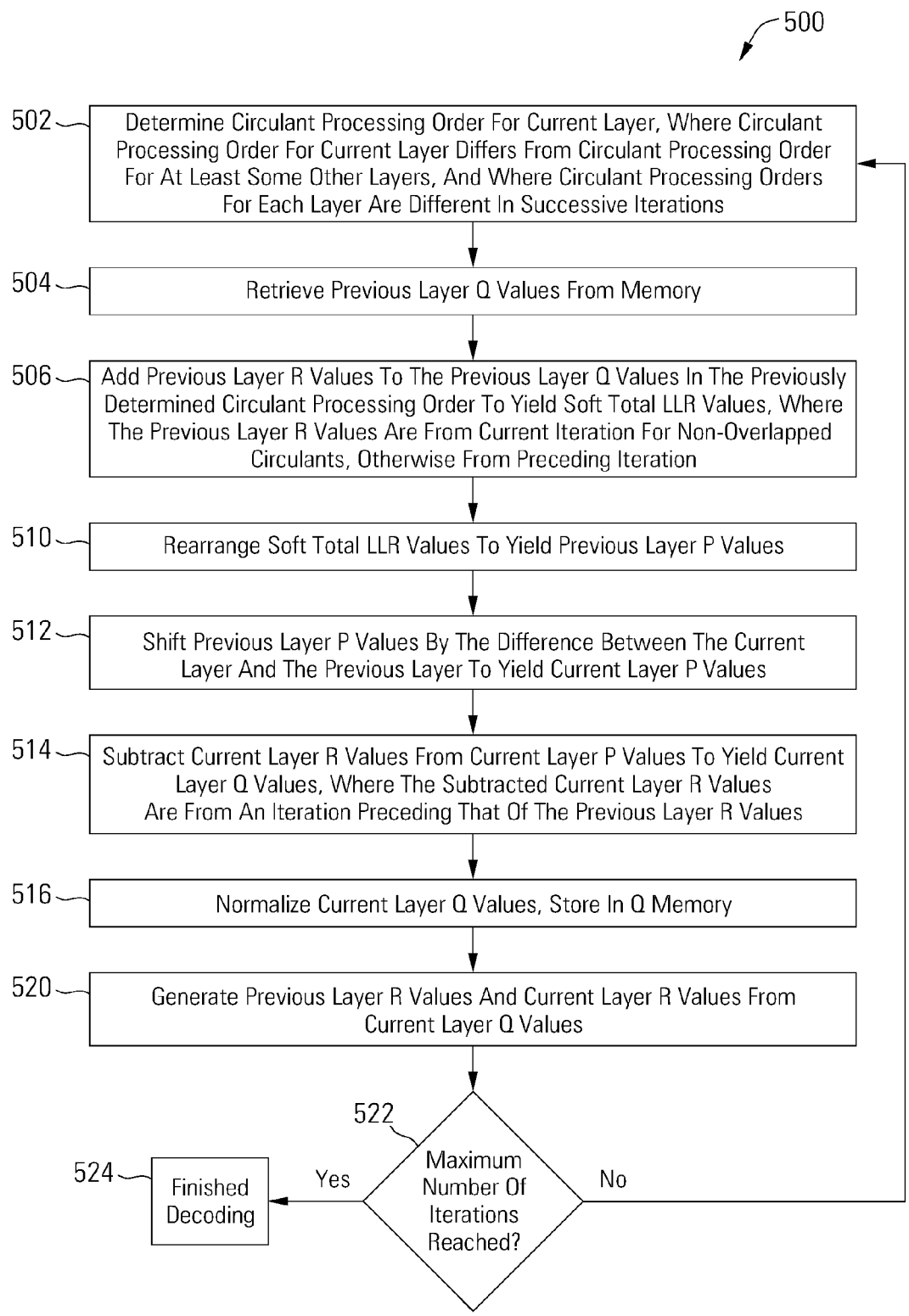
FIG. 5 depicts a flow diagram of an operation for layered decoding of an LDPC code with overlapped circulants in accordance with some embodiments of the present inventions.

Turning to FIG. 5, a flow diagram 500 is depicted of an operation for layered decoding of an LDPC code with overlapped circulants in accordance with some embodiments of the present inventions. Following flow diagram 500, the circulant processing order is determined for the current layer (Block 502), such that the circulant processing order for the current layer is different from the circulant processing order for at least some other layers, and such that the circulant processing order is different for each layer in successive iterations. The previous layer Q values are retrieved from memory. (Block 504) The previous layer R values are added to the previous layer Q values in the previously determined circulant processing order to yield soft total LLR values. (Block 506) For overlapped circulants, the previous layer R values are taken from the preceding iteration, and for non-overlapped circulants, the previous layer R values are taken from the current iteration. The soft total LLR values are rearranged to yield previous layer R values. (Block 510) The previous layer R values are shifted by the difference between the current layer and the previous layer to yield current layer P values. (Block 512) The current layer R values are subtracted from the current layer P values to yield current layer Q values. (Block 514) The subtracted current layer R values are taken from an iteration preceding that of the previous layer R values. The current layer Q values are normalized and stored in the Q memory. (Block 516) Previous layer R values and current layer R values are generated from current layer Q values. (Block 520) A determination is made as to whether the maximum number of iterations has been reached. (Block 522) If so, decoding is finished. (Block 524) Otherwise, another decoding iteration is performed. (Block 504)

Figure 6:
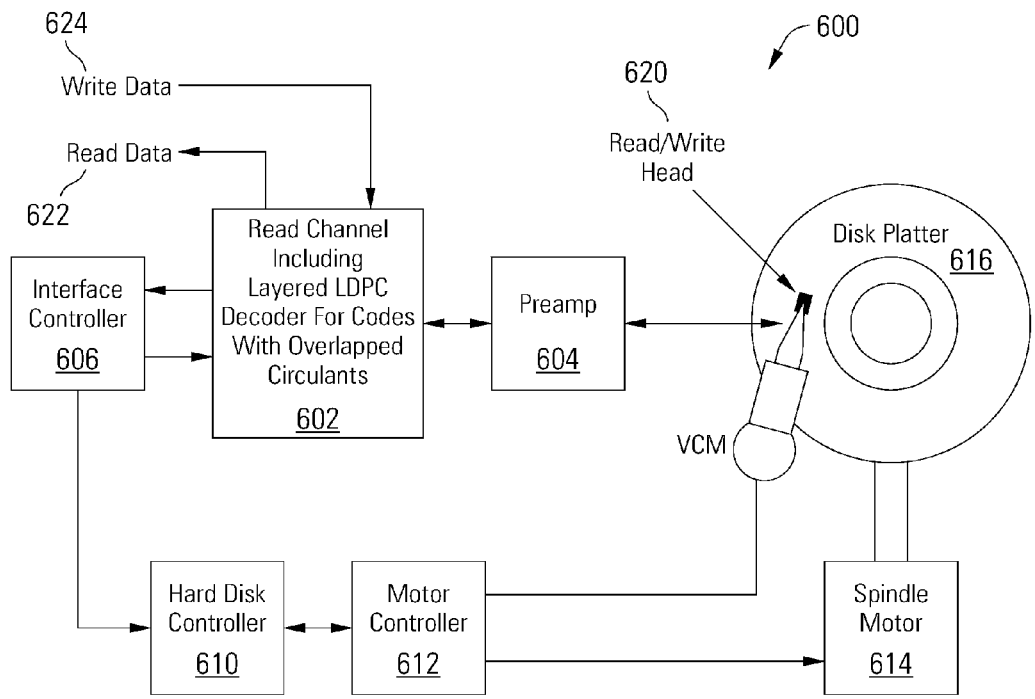
FIG. 6 depicts a storage system including a data processing circuit with an LDPC layer decoder for codes with overlapped circulants in accordance with some embodiments of the present inventions.

Turning to FIG. 6, a storage system 600 including a read channel circuit 602 having an LDPC layer decoder for codes with overlapped circulants is shown in accordance with some embodiments of the present inventions. Storage system 600 may be, for example, a hard disk drive. Storage system 600 also includes a preamplifier 604, an interface controller 606, a hard disk controller 610, a motor controller 612, a spindle motor 614, a disk platter 616, and a read/write head 620. Interface controller 606 controls addressing and timing of data to/from disk platter 616. The data on disk platter 616 consists of groups of magnetic signals that may be detected by read/write head assembly 620 when the assembly is properly positioned over disk platter 616. In one embodiment, disk platter 616 includes magnetic signals recorded in accordance with either a longitudinal or a perpendicular recording scheme.

In a typical read operation, read/write head assembly 620 is accurately positioned by motor controller 612 over a desired data track on disk platter 616. Motor controller 612 both positions read/write head assembly 620 in relation to disk platter 616 and drives spindle motor 614 by moving read/write head assembly to the proper data track on disk platter 616 under the direction of hard disk controller 610. Spindle motor 614 spins disk platter 616 at a determined spin rate (RPMs). Once read/write head assembly 620 is positioned adjacent the proper data track, magnetic signals representing data on disk platter 616 are sensed by read/write head assembly 620 as disk platter 616 is rotated by spindle motor 614. The sensed magnetic signals are provided as a continuous, minute analog signal representative of the magnetic data on disk platter 616. This minute analog signal is transferred from read/write head assembly 620 to read channel circuit 602 via preamplifier 604. Preamplifier 604 is operable to amplify the minute analog signals accessed from disk platter 616. In turn, read channel circuit 602 decodes and digitizes the received analog signal to recreate the information originally written to disk platter 616. This data is provided as read data 622 to a receiving circuit. As part of decoding the received information, read channel circuit 602 processes the received signal using an LDPC layer decoder for codes with overlapped circulants. Such an LDPC layer decoder for codes with overlapped circulants may be implemented consistent with that disclosed above in relation to FIGS. 3-4. In some cases, LDPC decoding with overlapped circulants may be performed consistent with the flow diagram disclosed above in relation to FIG. 5. A write operation is substantially the opposite of the preceding read operation with write data 624 being provided to read channel circuit 602. This data is then encoded and written to disk platter 616. It should be noted that various functions or blocks of storage system 600 may be implemented in either software or firmware, while other functions or blocks are implemented in hardware.

Storage system 600 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 600, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Figure 7:
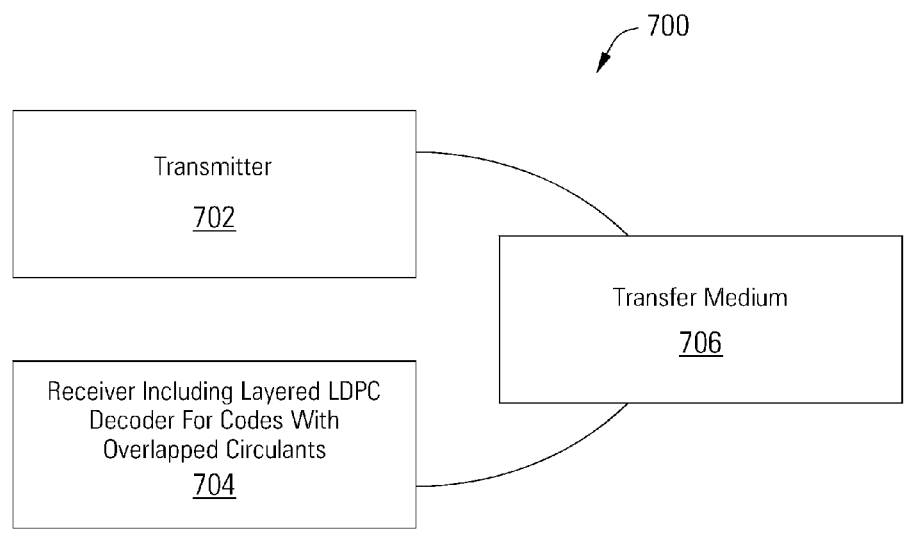
FIG. 7 depicts a wireless communication system including a data processing circuit with an LDPC layer decoder for codes with overlapped circulants in accordance with some embodiments of the present inventions.

Turning to FIG. 7, a data transmission system 700 including a receiver 704 having an LDPC layer decoder for codes with overlapped circulants is shown in accordance with various embodiments of the present invention. Data transmission system 700 includes a transmitter 702 that is operable to transmit encoded information via a transfer medium 706 as is known in the art. The encoded data is received from transfer medium 706 by a receiver 704. Receiver 704 processes the received input to yield the originally transmitted data. As part of processing the received information, receiver 704 decodes received data with an LDPC layer decoder for codes with overlapped circulants. Such an LDPC layer decoder for codes with overlapped circulants may be implemented consistent with that disclosed above in relation to FIGS. 3-4. In some embodiments, LDPC decoding with overlapped circulants may be performed consistent with the flow diagram disclosed above in relation to FIG. 5.

It should be noted that the various blocks discussed in the above application may be implemented in integrated circuits along with other functionality. Such integrated circuits may include all of the functions of a given block, system or circuit, or a portion of the functions of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, embodiments of the present inventions provide novel systems, devices, methods and arrangements for an LDPC layer decoder for codes with overlapped circulants. While detailed descriptions of one or more embodiments of the invention have been given above, various alternatives, modifications, and equivalents will be apparent to those skilled in the art without varying from the spirit of the invention. Therefore, the above description should not be taken as limiting the scope of embodiments of the invention which are encompassed by the appended claims.

What is claimed is:

1. An apparatus for low density parity check decoding comprising:
    a variable node processor operable to generate variable node to check node messages and to calculate perceived values based on check node to variable node messages;
    a check node processor operable to generate the check node to variable node messages and to calculate checksums based on variable node to check node messages; and
    a scheduler operable to select older variable node to check node messages for overlapped circulants for the check node processor to use when generating the check node to variable node messages, wherein the decoding comprises layer decoding, and wherein the selection of older variable node to check node messages for overlapped circulants comprises selecting variable node to check node messages prepared earlier than a previous decoding iteration.

2. The apparatus of claim 1, wherein the overlapped circulants comprise circulants in a same H-matrix column that are processed in parallel in the apparatus for low density parity check decoding.

3. The apparatus of claim 1, wherein the check node processor is operable to process the variable node to check node messages for a circulant in an H-matrix when the check node processor becomes available, without waiting for processing of a connected overlapped circulant to be completed.

4. The apparatus of claim 1, wherein the variable node processor comprises an adder operable to add previous layer check node to variable node messages to previous layer Q values, wherein the previous layer check node to variable node messages are for a current decoding iteration for non-overlapped circulants and from a preceding decoding iteration for overlapped circulants.

5. The apparatus of claim 1, wherein the variable node processor comprises a subtractor operable to subtract current layer check node to variable node messages from current layer P messages, wherein the current layer check node to variable node messages are for a preceding decoding iteration for non-overlapped circulants and from a twice-preceding decoding iteration for overlapped circulants.

6. The apparatus of claim 1, further comprising a memory operable to store data based on the variable node to check node messages for at least two decoding iterations.

7. The apparatus of claim 6, wherein the memory is operable to store minimum, next minimum and index of minimum data based on the variable node to check node messages for a preceding decoding iteration and for a twice-preceding decoding iteration.

8. The apparatus of claim 1, further comprising a memory storing a plurality of flags identifying the overlapped circulants.

9. The apparatus of claim 1, further comprising a scheduler operable to select the older variable node to check node messages for the overlapped circulants or current variable node to check node messages for non-overlapped circulants.

10. The apparatus of claim 1, further comprising a scheduler operable to vary a circulant processing order across a plurality of layers in a decoding iteration.

11. The apparatus of claim 1, further comprising a scheduler operable to vary circulant processing orders for layers across a plurality decoding iterations.

12. The apparatus of claim 1, wherein the apparatus is implemented as an integrated circuit.

13. The apparatus of claim 1, wherein the apparatus is incorporated in a storage device.

14. The apparatus of claim 13, wherein the storage device comprises a redundant array of independent disks.

15. The apparatus of claim 1, wherein the apparatus is incorporated in a transmission system.

16. A storage system comprising:
    a storage medium maintaining a data set;

a read/write head assembly operable to sense the data set on the storage medium; and a layer low density parity check decoder for processing the data set comprising:

a variable node processor operable to generate variable node to check node messages and to calculate perceived values based on check node to variable node messages;

a check node processor operable to generate the check node to variable node messages and to calculate checksums based on variable node to check node messages; and a scheduler operable to select older variable node to check node messages for overlapped circulants for the check node processor to use when generating the check node to variable node messages, wherein the selection of older variable node to check node messages for overlapped circulants comprises selecting variable node to check node messages prepared by the variable node processor earlier than a previous decoding iteration.

17. The storage system of claim 16, wherein the scheduler is configured to schedule circulants for out-of-order processing to rotate effects of the selection of older variable node to check node messages.

18. The storage system of claim 16, wherein the scheduler is configured to schedule circulants for out-of-order processing wherein a circulant processing order in each layer of a decoding iteration is different from other decoding iterations.

19. The storage system of claim 16, wherein the variable node processor comprises a subtractor operable to subtract current layer check node to variable node messages from current layer P messages, wherein the current layer check node to variable node messages are for a preceding decoding iteration for non-overlapped circulants and from a twice-preceding decoding iteration for overlapped circulants.

20. The storage system of claim 16, wherein the layer low density parity check decoder further comprises a memory configured to store data based on the variable node to check node messages for a preceding decoding iteration and for a twice-preceding decoding iteration.

* * * * *